US009679951B2

(12) United States Patent
Hou et al.

(10) Patent No.: US 9,679,951 B2
(45) Date of Patent: Jun. 13, 2017

(54) PIXEL DEFINING LAYER, ORGANIC ELECTROLUMINESCENT DEVICE AND DISPLAY DEVICE

(71) Applicant: Boe Technology Group Co., Ltd., Beijing (CN)

(72) Inventors: Wenjun Hou, Beijing (CN); Chinlung Liao, Beijing (CN); Ze Liu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/785,428

(22) PCT Filed: Jan. 27, 2015

(86) PCT No.: PCT/CN2015/071609
§ 371 (c)(1),
(2) Date: Oct. 19, 2015

(87) PCT Pub. No.: WO2016/065755
PCT Pub. Date: May 6, 2016

(65) Prior Publication Data
US 2016/0358987 A1     Dec. 8, 2016

(30) Foreign Application Priority Data
Oct. 30, 2014   (CN) .......................... 2014 1 0601922

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3283* (2013.01); *H01L 51/52* (2013.01); *H01L 51/56* (2013.01); *H01L 2227/323* (2013.01)

(58) Field of Classification Search
CPC .................................. H01L 51/52; H01L 51/56
See application file for complete search history.

(56) References Cited

U.S. PATENT DOCUMENTS

2006/0046062 A1*  3/2006  Nishigaki ............... B29C 41/12
                                                            428/411.1
2008/0067506 A1*  3/2008  Takei .................. H01L 27/3246
                                                                257/40

(Continued)

FOREIGN PATENT DOCUMENTS

CN          1622706        6/2005
CN          1956167        5/2007

(Continued)

OTHER PUBLICATIONS

International Search Report and Written Opinion from PCT/CN15/071609 dated Aug. 5, 2015.

(Continued)

*Primary Examiner* — Kyoung Lee
*Assistant Examiner* — Christina Sylvia
(74) *Attorney, Agent, or Firm* — Calfee, Halter & Griswold LLP

(57) ABSTRACT

The present invention relates to the field of display technology, particularly to a pixel defining layer, an organic electroluminescent device and a display device. The pixel defining layer comprises a first defining layer on an array substrate and a second defining layer on the first defining layer, wherein the first defining layer is made of a lyophilic inorganic material, and the second defining layer is made of a lyophobic organic material. The present invention provides a pixel defining layer, an organic electroluminescent device and a display device, wherein ink-jet printing technology is used to patternize pixels of an organic material, which serves as not only a protective layer on the first inorganic material layer during dry etching, but also a lyophobic layer on the (Continued)

second layer; the making of the double-layered pixel defining layer omits the process of using two masks, which can effectively reduce costs and improve production efficiency.

4 Claims, 3 Drawing Sheets

(56) References Cited

U.S. PATENT DOCUMENTS

| | | | | |
|---|---|---|---|---|
| 2010/0252857 A1* | 10/2010 | Nakatani | ............ | H01L 27/3246 |
| | | | | 257/100 |
| 2011/0227100 A1 | 9/2011 | Kurihara et al. | | |
| 2016/0056218 A1* | 2/2016 | Wang | .................. | H01L 51/0004 |
| | | | | 257/40 |

FOREIGN PATENT DOCUMENTS

| | | |
|---|---|---|
| CN | 101090132 | 12/2007 |
| CN | 101355097 | 1/2009 |
| CN | 101855742 | 10/2010 |
| CN | 102386206 | 3/2012 |
| JP | 2008243406 | 10/2008 |

OTHER PUBLICATIONS

Office action from Chinese Application No. 201410601922.8 dated May 19, 2016.
Office action from Chinese application No. 201410601922.8 dated Nov. 10, 2016.

* cited by examiner

PIXEL DEFINING LAYER, ORGANIC ELECTROLUMINESCENT DEVICE AND DISPLAY DEVICE

CROSS-REFERENCE TO RELATED APPLICATIONS

The present application is the U.S. national phase entry of PCT/CN2015/071609, filed on Jan. 27, 2015 which claims the benefit of Chinese Patent Application No. 201410601922.8, filed on Oc. 30, 2014, the entire disclosures of which are incorporated herein by reference.

FIELD OF THE INVENTION

The present invention relates to the field of display technology, particularly to a pixel defining layer, an organic electroluminescent device and a display device.

BACKGROUND OF THE INVENTION

In relation to OLED (Organic Light-Emitting Diode) or PLED (Polymer Light-Emitting Diode), the method for forming an organic film includes:

(1) a vacuum deposition process which is applicable to small organic molecules and characterized in that an organic film can be formed without a solvent to have a uniform thickness, but with disadvantages of high equipment investment, low material utilization and incapability of manufacturing large-sized products; and (2) solution-related method, including spin coating, ink-jet printing, nozzle coating method, applicable to polymer materials and small soluble molecules, which is characterized by low equipment costs, and prominent performance on large-scale, large-sized production. In particular, the ink-jet printing technology enables a solution to be precisely ink-jetted into a pixel region to thereby form an organic film. But the biggest difficulty lies in that the organic solution in the pixel area can hardly form an organic film having a uniform thickness.

SUMMARY OF THE INVENTION (I) The Technical Problem to be Solved

The object of the present invention is to provide a pixel defining layer, an organic electroluminescent device and a display device, in order to overcome the defect in the prior art that organic solution can hardly form an organic thin film having a uniform thickness in a pixel area.

(II) Technical Solution

To achieve the above object, the present invention adopts the following technical solutions:

in one aspect, the present invention provides a pixel defining layer, comprising a first defining layer on an array substrate and a second defining layer on the first defining layer;

the first defining layer is made of a lyophilic inorganic material; and the second defining layer is made of a lyophobic organic material.

Preferably, the lyophilic inorganic material comprises $SiO_2$ or $SiN_x$.

Preferably, the lyophobic organic material comprises a polyimide photoresist, an acrylic-like photoresist and an organic insulating material.

In another aspect, the present invention also provides an organic electroluminescent device comprising the pixel defining layer as described above.

In a further aspect, the present invention also provides a display device comprising the organic electroluminescent device as described above.

In a further aspect, the present invention also provides a method for manufacturing a pixel defining layer, comprising:

step S1: preparing a layer of lyophilic inorganic material on the array substrate;

step S2: conducting a lyophobic performance process on the surface of the lyophilic inorganic material;

step S3: ink-jet printing the lyophobic organic material on the surface of the inorganic material, and forming patterns of pixel regions;

step S4: removing the inorganic material exposed between adjacent pixel regions.

Preferably, the step S2 comprises: treating the surface of the lyophilic inorganic material by carbon tetrafluoride and fluorinated silane, so that the water contact angle on the surface of the lyophilic inorganic material ranges from 60° to 120°.

Preferably, the step S3 comprises: ink-jet printing polyimide photoresist on the surface of the inorganic material, first longitudinally and then horizontally, so as to form patterns of pixel regions.

(III) The Beneficial Effects

The present invention provides a pixel defining layer, an organic electroluminescent device and a display device with the following advantages:

(1) using ink-jet printing technology to patternize pixels of an organic material, which serves as not only a protective layer on the first inorganic material layer during dry etching, but also a lyophobic layer on the second layer;

(2) the making of the double-layered pixel defining layer omits the process of using two masks, which can effectively reduce costs and improve production efficiency.

DETAILED DESCRIPTION OF THE INVENTION

The embodiments of the present invention will be further described in detail with reference to the drawings and examples. The following examples are used to explain the present invention, rather than limit the scope of the present invention.

Figure 6:
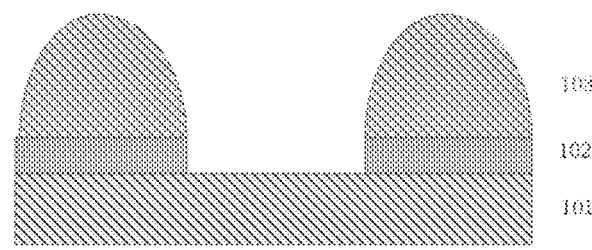

As shown in FIG. 6, the example of the present invention provides a pixel defining layer, comprising a first defining layer 102 on an array substrate 101 and a second defining layer 103 on the first defining layer;

The first defining layer 102 is made of a lyophilic inorganic material; The second defining layer 103 is made of a lyophobic organic material.

The lyophilic inorganic material preferably comprises $SiO_2$ or $SiN_x$, and the lyophobic organic material preferably comprises a polyimide photoresist, an acrylic-like photoresist and an organic insulating material.

Furthermore, the present invention also provides an organic electroluminescent device comprising the pixel defining layer as described above.

In addition, the present invention also provides a display device comprising the organic electroluminescent device as described above. The display device includes, but is not limited to, equipments such as liquid crystal displays (LCDs), LCD TVs and LCD screens, and display devices that need display modules, such as digital photo frames, electronic paper and mobile phones.

Figure 1:
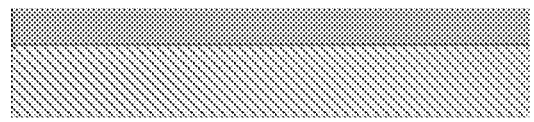
FIGS. 1 to 6 are structural schematic views of a pixel defining layer according to the embodiment of the present invention.
Figure 2:
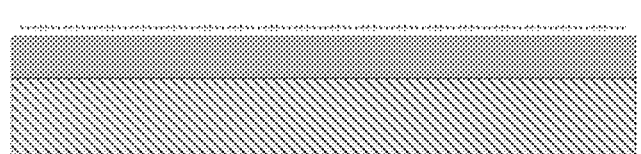
Figure 3:
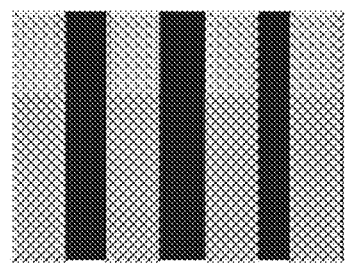
Figure 4:
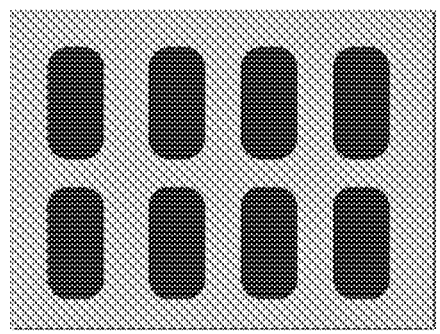
Figure 5:
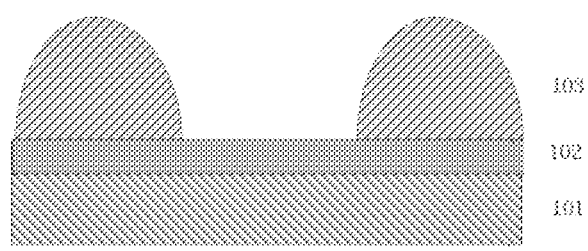
Figure 7:
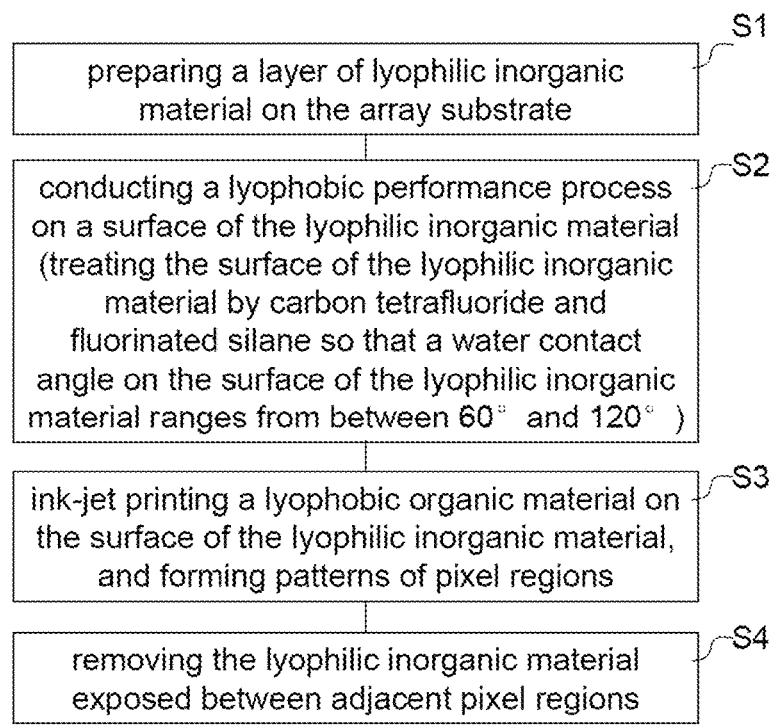
FIG. 7 is a flow chart showing the method for making the pixel defining layer according to the embodiment of the present invention, wherein the reference sign 101 is an array substrate; 102 a first defining layer; 103 a second defining layer; 104 lyophobic treatment.

Moreover, as shown in FIG. 7, the present invention also provides a method for manufacturing a pixel defining layer, comprising:

step S1: preparing a layer of lyophilic inorganic material on the array substrate;

to be specific, preparing a layer of lyophilic inorganic material $SiO_2$ on the array substrate by means of PECVD, with a thickness thereof ranging from 50 nm to 300 nm, preferable 50 nm to 200 nm, as shown in FIG. 1.

step S2: conducting a lyophobic performance process on the surface of the lyophilic inorganic material;

to be specific, treating the prepared $SiO_2$ surface to reduce its surface energy such that ink does not extend on the surface, and treating the surface usually by carbon tetrafluoride and fluorinated silane so that the water contact angle on the $SiO_2$ surface ranges from 60° to 120°, as shown in FIG. 2.

step S3: ink-jet printing the lyophobic organic material on the surface of the inorganic material, and forming patterns of pixel regions;

to be specific, ink-jet printing polyimide photoresist on the surface of the inorganic material, first longitudinally and then horizontally, so as to form patterns of pixel regions, as shown in FIGS. 3 to 5, or alternatively, first horizontally and then longitudinally so as to form patterns of pixel regions.

step S4: removing the inorganic material exposed between adjacent pixel regions;

to be specific, removing $SiO_2$ in the pixel region by means of dry etching and form a double-layered pixel defining layer, according to FIG. 6.

The present invention provides a pixel defining layer, an organic electroluminescent device and a display device with the following advantages:

(1) using ink-jet printing technology to patternize pixels of an organic material, which serves as not only a protective layer on the first inorganic material layer during dry etching, but also a lyophobic layer on the second layer;

(2) the making of the double-layered pixel defining layer omits the process of using two masks, which can effectively reduce costs and improve production efficiency.

What are stated above are only preferred embodiments of the present invention. It should be noted that those ordinarily skilled in the art can make various modifications and variations without departing from the technical principles of the present invention, and these modifications and variations shall be deemed to be within the protection scope of the present invention.

The invention claimed is:

1. A method for manufacturing a pixel defining layer comprising:
    preparing a layer of lyophilic inorganic material on an array substrate;
    conducting a lyophobic performance process on a surface of the lyophilic inorganic material;
    ink-jet printing a lyophobic organic material on the surface of the lyophilic inorganic material, and forming patterns of pixel regions; and
    removing the lyophilic inorganic material exposed between adjacent pixel regions;
    wherein the ink-jet printing the lyophobic organic material on the surface of the lyophilic inorganic material, and forming patterns of pixel regions further comprises:
        ink-jet printing polyimide photoresist on the surface of the lyophilic inorganic material to form patterns of pixel regions; wherein the ink-jet printing polyimide photoresist on the surface of the lyophilic inorganic material is first done longitudinally, and then the ink-jet printing polyimide photoresist on the surface of the lyophilic inorganic material is done horizontally.

2. The method for manufacturing the pixel defining layer of claim 1 whererin the conducting the lyophobic performance process on the surface of the lyophilic inorganic material further comprises:
    treating the surface of the lyophilic inorganic material by carbon tetrafluoride and fluorinated silane so that a water contact angle on the surface of the lyophilic inorganic material ranges from between 60° and 120°.

3. The method for manufacturing the pixel defining layer of claim 1, wherein the lyophilic inorganic material of the first defining layer comprises one of $SiO_2$ or $SION_x$.

4. The method for manufacturing the pixel defining layer of claim 1, wherein the lyophobic organic material of the second defining layer comprises:
    a polyimide photoresist;
    an acrylic-like photoresist; and
    an organic insulating material.

* * * * *